United States Patent
Komura et al.

(10) Patent No.: US 6,566,878 B1
(45) Date of Patent: May 20, 2003

(54) MAGNETIC RESONANCE IMAGING DEVICE AND METHOD THEREFOR

(75) Inventors: Kazumi Komura, Chiba (JP); Tetsuhiko Takahashi, Saitama (JP)

(73) Assignee: Hitachi Medical Corporation, Tokyo (JP)

(*) Notice: Subject to any disclaimer, the term of this patent is extended or adjusted under 35 U.S.C. 154(b) by 0 days.

(21) Appl. No.: 10/070,615

(22) PCT Filed: Sep. 8, 2000

(86) PCT No.: PCT/JP00/06154

§ 371 (c)(1),
(2), (4) Date: May 16, 2002

(87) PCT Pub. No.: WO01/17428

PCT Pub. Date: Mar. 15, 2001

(30) Foreign Application Priority Data

Sep. 9, 1999 (JP) .......................... 11-255848
Mar. 28, 2000 (JP) .......................... 2000-089698

(51) Int. Cl.⁷ .............................. G01V 3/00
(52) U.S. Cl. ....................... 324/315; 324/300
(58) Field of Search ..................... 324/315, 300, 324/306, 307, 309, 312, 314, 318, 322

(56) References Cited

U.S. PATENT DOCUMENTS 6,064,206 A * 5/2000 Van Vaals et al. .......... 324/309
6,194,899 B1 * 2/2001 Ishihara et al. ............ 324/315
6,377,834 B1 * 4/2002 Zhou et al. ................ 324/315

* cited by examiner

Primary Examiner—Louis Arana
(74) Attorney, Agent, or Firm—Antonelli, Terry, Stout & Kraus, LLP

(57) ABSTRACT

Variations in spatial phase distribution due to static magnetic field changes are corrected based on phase variations at points, specifically, at three points or a plurality of points selected by ROI, in an area where no temperature change is encountered. And a temperature distribution image is determined by using a spatial phase distribution reflecting only temperature changes after the correction, thereby high-accuracy temperature distribution image information is provided.

18 Claims, 11 Drawing Sheets

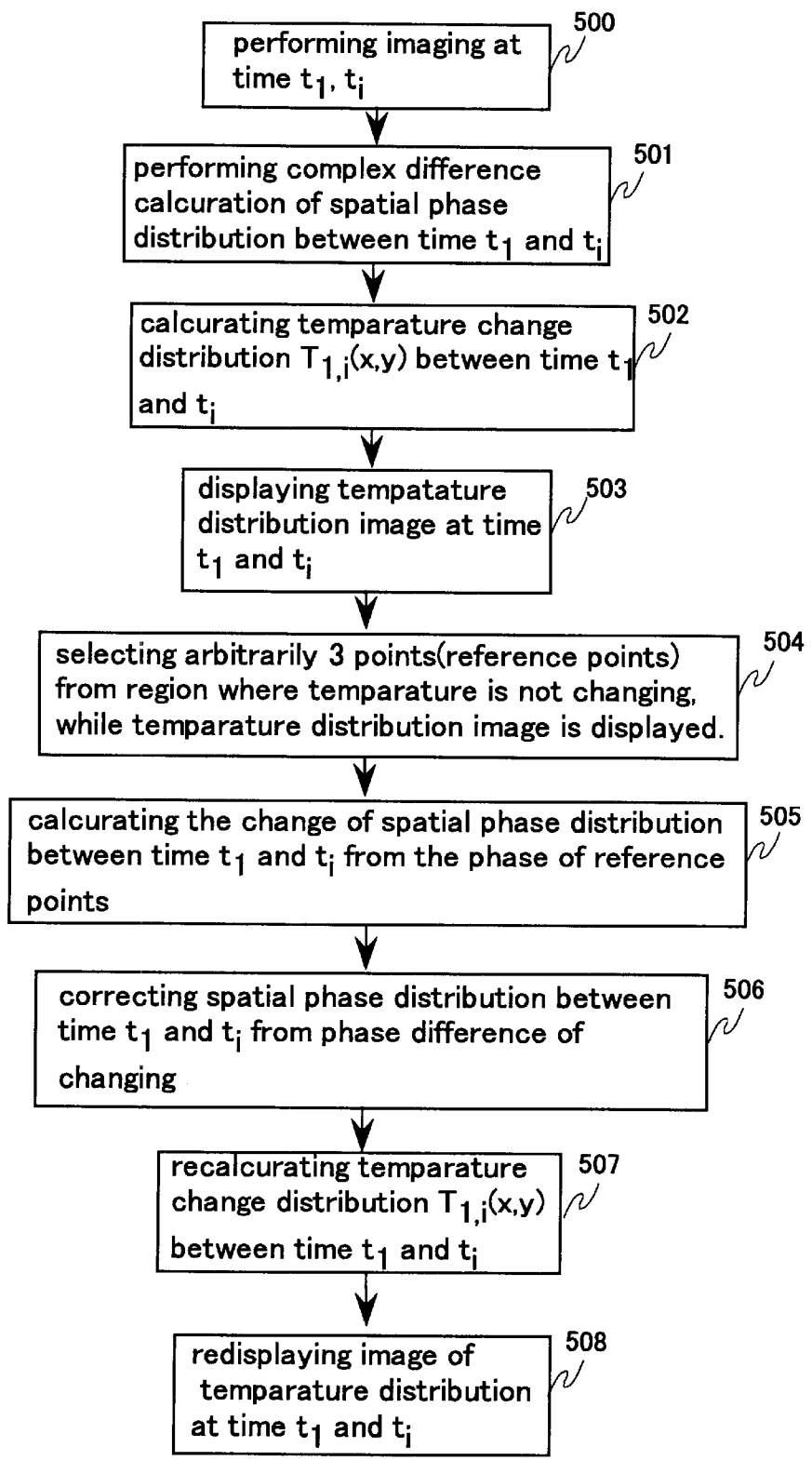

Fig. 9
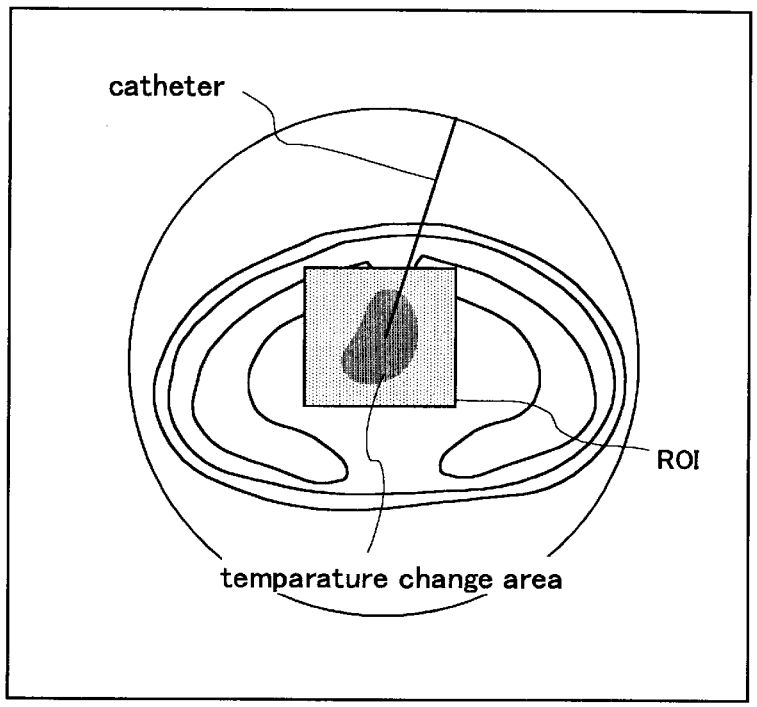
(a) superimposing temparature distribution image inside ROI upon anatomical imege
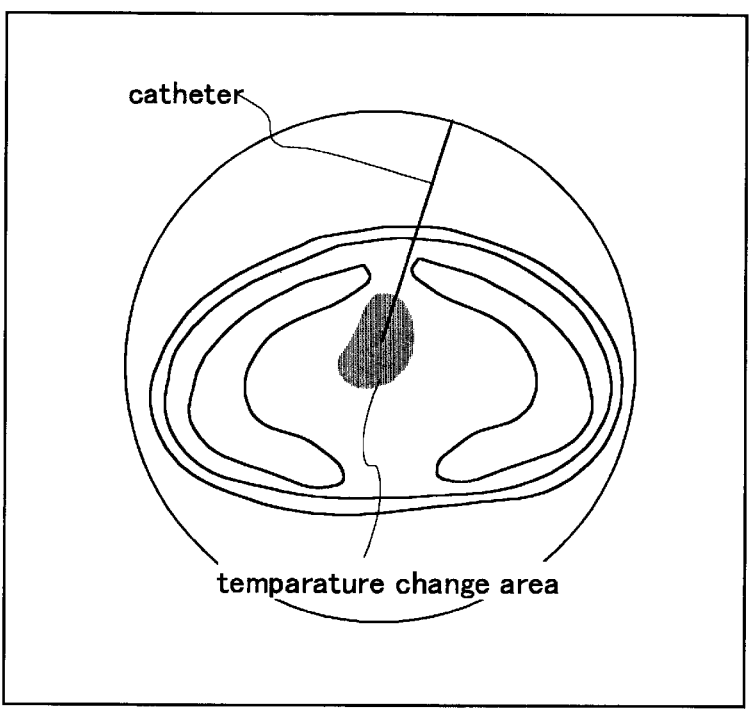
(b) superimposing only the region where temperature change more than predetermined value upon the anatomical image

MAGNETIC RESONANCE IMAGING DEVICE AND METHOD THEREFOR

FIELD OF THE INVENTION

This invention relates to a magnetic resonance imaging apparatus (hereinafter this is referred to MRI), especially to technology being suitable for measuring an image of a temperature distribution in a living body with a MRI apparatus.

BACKGROUND OF THE ART

Recently interventional MRI (hereinafter, this is referred to IV-MRI) using an MRI apparatus as a surgery monitor is attended. In a therapy method performed by using IV-MRI, there is a laser treatment, a drag injection of ethanol or the like, an RF irradiation excision, and a low temperature treatment. In these treatments, MRI plays a role for guiding a needle or a narrow tube to a diseased part by real time imaging, or visualizing a change of tissues in said treatments, or monitoring a limited part in application of heating or cooling treatment, or the like. A typical application for IV-MRI includes an imaging of the temperature distribution within the body when said laser treatment is performed.

Imaging method of the temperature distribution includes method for calculating from signal intensity, method for calculating from diffusion coefficient, method for calculating from phase shift of proton (PPS method: Proton Phase Shift method), or the like. PPS method is the best in measuring accuracy. This function has made it possible to monitor the temperature in the living body, monitor of the laser irradiating treatment, temperature monitor of the RF (Radio Frequency) ablation.

For example, in PPS method a temperature distribution is calculated from phase information of an echo signal obtained with alternating gradient magnetic field. FIG. 1 shows one example of a method to measure such phase information. Hereinafter, a measuring method shown FIG. 1 and a calculating method of phase distribution or temperature distribution will be described.

At first, a spin in a sample is excited by irradiating 90° high frequency pulse 101 (hereinafter this is referred to 90° pulse) together with an application of gradient magnetic field Gs 102 for selecting the slice. Then gradient magnetic field Gp 103 and reading out gradient magnetic field Gr 104 for changing the phase of excited spin are applied successively to generate gradient echo signal 105. Then a Fourier transformation is performed on said echo signal to create a real part or an imaginary part of complex image, and a phase distribution is calculated. For example, said phase distribution is calculated from equation (1).

$$\Phi(x,y,z)=\tan^{-1}\{Si(x,y,z)/Sr(x,y,z)\} \quad (1)$$

And temperature T is calculated from acquired phase distribution, interval TE (106) between the time that echo signal is the maximum and the time applying 90° pulse, resonance frequency f, temperature coefficient of water. For example, temperature T is calculated from equation (2).

$$T[°C.]=\Phi[°]/\{TE[s]*f[Hz]*0.01[ppm/°C.]10^{-6}*360[°]\} \quad (2)$$

By using said method, the difference of the temperature distribution is calculated respectively from signal acquired at a different time $t_1 \ldots t_n$ (n is a imaging number) to produce the distribution of temperature change in the object to be examined at a certain time.

When images are acquired with the repetition of measurement, temperature of a magnet and a pole piece is rose with the heating-up of GC coil, and a static magnetic field and offset of the gradient magnetic field changes. Changing of the static magnetic field and offset of the gradient magnetic field is equivalent to the change of the spatial distribution of resonance frequency f. Therefore if resonance frequency f is not measured at every position of every imaging, accurate temperature distribution is not obtained because it is affected by the static magnetic field change. However, IV-IMR is necessary to acquire images of temperature distribution with real time. But measuring the distribution of resonance frequency f at every imaging, imaging time is increased. Then the real time in imaging is lost.

As thus described when the change of temperature distribution is measured with MRI apparatus, it is important to avoid influence caused by change of the static magnetic field for obtaining the accuracy or the real time of the temperature distribution.

The object of the present invention is to solve these problems and to provide high accurate image of temperature change distribution.

DISCLOSURE OF THE INVENTION

In order to solve said problems in the present invention, a magnetic resonance imaging apparatus comprises static magnetic field generation means for applying a static magnetic field to the object to be examined, gradient magnetic field generation means for applying a slice direction gradient magnetic field, a frequency encoding gradient magnetic field and a phase encoding gradient magnetic field to said object, high frequency pulse generation means for generating high a frequency pulse for causing magnetic resonance to the nucleus composing said object, detecting means for detecting a nuclear magnetic resonance signal from said object, reconstruction means for reconstructing an image from said a nuclear magnetic resonance signals, display means for displaying said reconstructed image, and a control means for controlling said each means. And said control means performs measuring spatial phase distributions including a temperature information at different time, getting a reference phase in said spatial phase distributions by complex difference calculating to said spatial phase distributions at said different time, calculating the difference between said reference phase and a spatial phase distribution applied to said difference calculation, and getting temperature change distribution from said spatial phase distribution applied to said difference calculation.

In addition, said magnetic resonance imaging apparatus further comprises selecting means for selecting arbitrary position in the image displayed on said displaying means. And it is preferable to get said reference phase from the position selected by said selecting means, and to select plural number of points which is positions for getting reference phase after specifying arbitrary region in the image displayed on the display means.

In addition, it is preferable to get reference phase from at least one point within the region where temperature is not changing or plural number of points that do not form a line within the region where temperature is not changing by said control means.

In addition, it is preferable to display in parallel temperature image including temperature information and reconstructed anatomical image, or superimpose image of temperature changing region in said temperature image including temperature information on the reconstructed anatomical image by said display means.

In addition, it is preferable to specify arbitrary region in the image displayed said display means and select plural number of points for calculating reference phase on the line in said region, and to specify region including temperature change region.

In addition, it is preferable to perform by fitting process considering temporal change of the reference phase.

In the present invention having previous described compositions, temperature distribution change is obtained accurately by correcting the change of spatial phase distribution at each position due to static magnetic field change with reference to the phase change of plural number of points on the region where temperature is not changing, for example arbitrary three points or plural number of points above line in the arbitrary region.

BRIEF DESCRIPTION OF THE DRAWINGS

FIGS. 5(a)–(b) is a flow chart showing one example of selection of a reference point in the embodiment of the present invention.

FIG. 9 is a figure showing the fourth example of screen of the present invention.

THE BEST MODE FOR CARRYING OUT THE INVENTION

Figure 1:
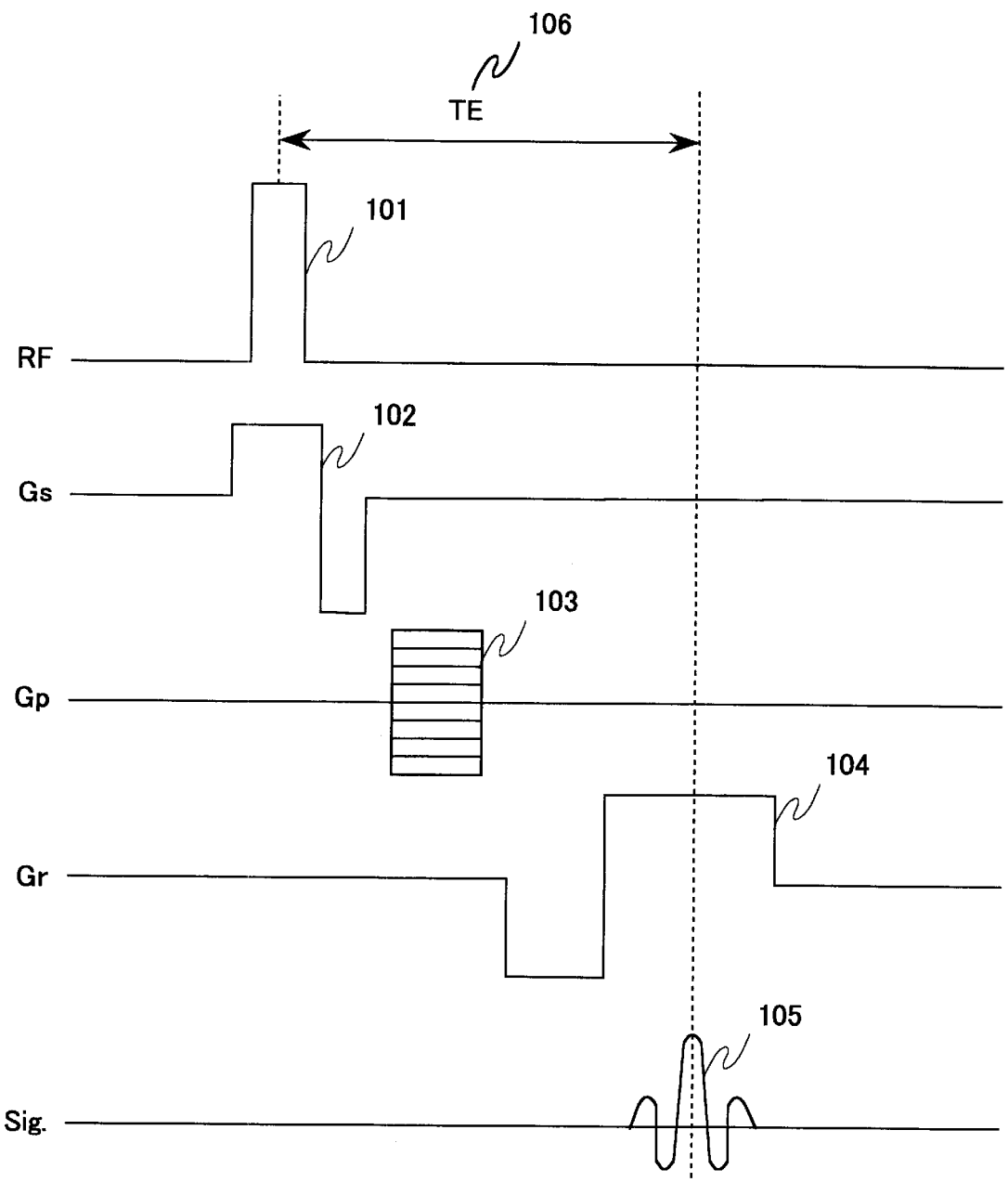
FIG. 1 shows an imaging sequence of the present invention.
Figure 2:
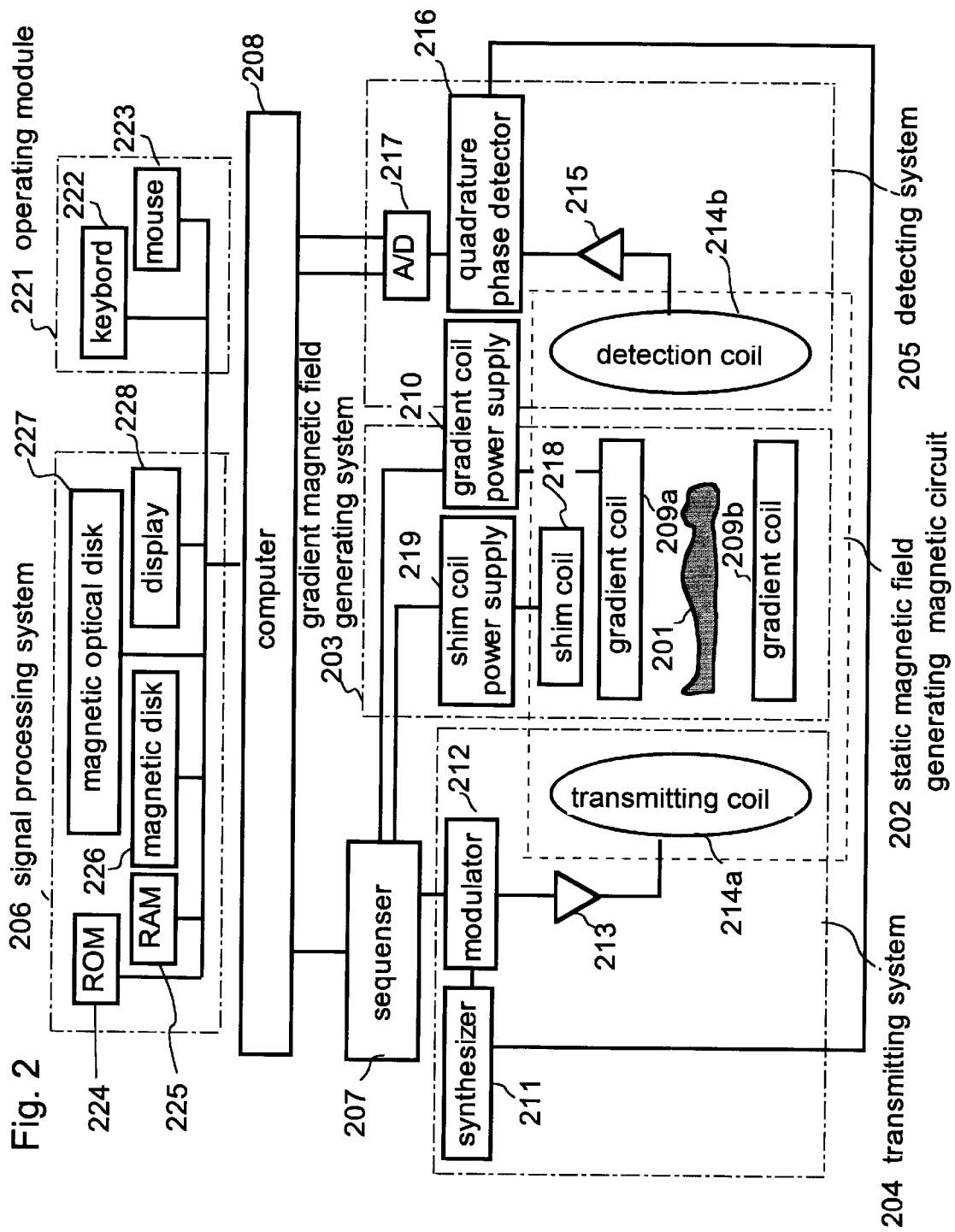
FIG. 2 is a block diagram of one embodiment showing the composition of the present invention.
Figure 3:
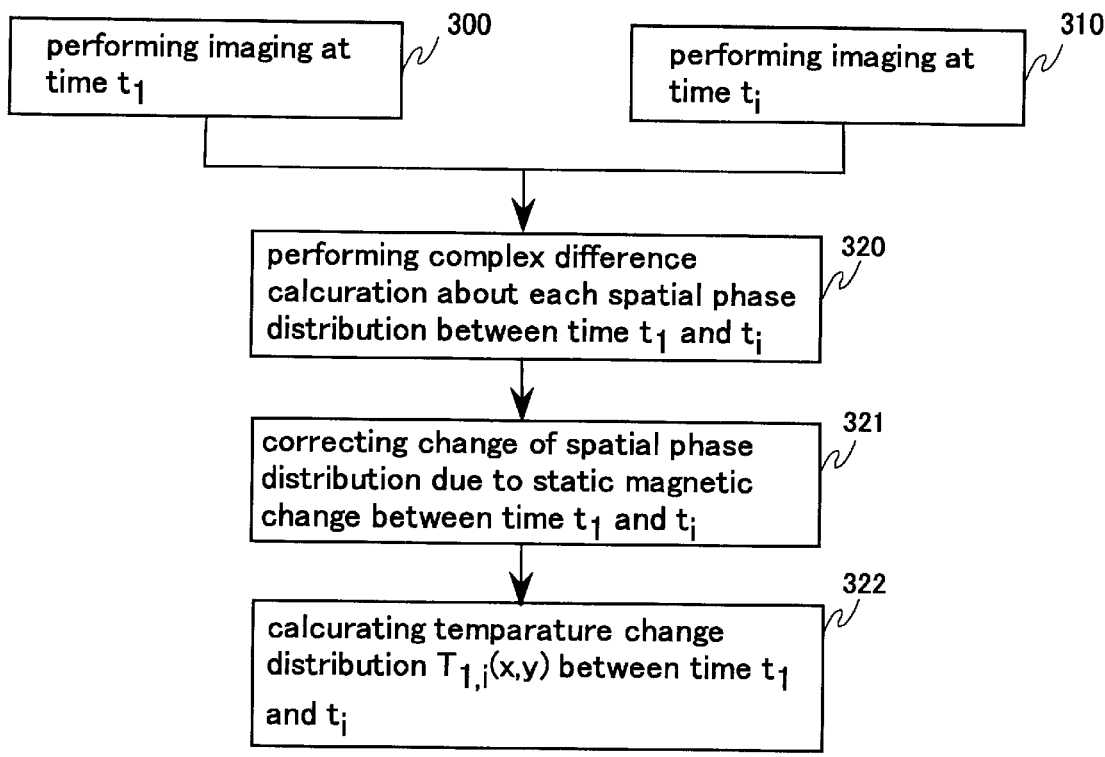
FIG. 3 is a flow chart showing embodiment of the present invention.

One embodiment of the present invention will now be explained referring to FIG. 1 to FIG. 11. At first, the composition of MRI apparatus in the embodiment is explained in FIG. 2. An MRI apparatus comprises magnetic circuit 202 for generating a static magnetic field having an electromagnet or a permanent magnet for generating an uniform static magnetic field H0 in interior of the object to be examined 201, gradient magnetic field coil 209 for generating gradient magnetic field Gx, Gy, Gz, of which the intensity varies linearly to the three direction x, y, and z perpendicular to the object 201, transmitting coil 214a for transmitting a high frequency magnetic field to the object 201, detecting coil 214b for detecting a nuclear magnetic resonance signals generated from the object 201, and sequencer 207 for making generation of a gradient magnetic field or a high frequency pulse at a predetermined timing, computer 208 for performing various kinds of processing such as controlling of sequencer or image processing or the like, signal processing system 206 for displaying or accommodating an image, and operating part 221 for performing operation of the setting of various kinds of parameter, and so on.

Next, outline of the operation will be described. A high frequency pulse generated from synthesizer 211 is modulated in modulator 212 then amplified on power amplifier 213, and it is supplied to transmission coil 214a, and a high frequency magnetic field is transmitted to the interior of the object 201, and nuclear spin is excited. Usually, excited spin for object is $^1H$. But other nucleus such as $^{31}P$, $^{13}C$ having a nuclear spin for object is selected too.

Nuclear magnetic resonance signals having emitted from the object 201 is received by detecting coil 214b. And it is passed through the amplifier 215, and it is quadrate phase detected by detector 216. And it is inputted to computer 208 through A/D converter 217. In this embodiment, transmission coil 214a and detecting coil 214b are comprised separately, but it is preferable to use for both transmitting and receiving. After having processed a signal in computer 208, said density distribution image of said nuclear spin, relaxation time distribution, spectrum distribution etc. are displayed to display 228 such as CRT. Sequencer 207 controls both operation of gradient magnetic field generation system 203 and transmission system 204. And computer 208 controls both operation of sequencer 207 and detection system 205. Computer 208 is controlled by a command supplied from operation part 221.

Next, procedure of the temperature measurement and imaging will be explained. At first, complex signal from the object to be examined is measured by gradient echo method (hereinafter this is referred to GrE) sequence such as shown in FIG. 1. Tow dimensional transformation is performed on the measured complex signal to acquire complex image. Then phase distribution is calculated from the complex image. In this case, other sequence can be used, if it is GrE type. In GrE type, component of (resonance frequency)× (static magnetic field) is included in a phase component of an echo signal. In PPS method temperature dependency of this resonance frequency is used. As example of those sequence high speed GrE sequences such as SARGE, TRSARGE, RFSARGE, or SSFP (Steady State Free Precession) sequence, or EPI (Echo Planar Imaging) sequence of GrE type can be utilized.

And phase distribution is measured at each time t1, ti (i is more than 2; repetition number imaging) (in step 300, step 310). And complex difference calculation about each spatial phase distribution is performed (in step 320). This calculated spatial phase distributions reflect phase change due to temperature change and static magnetic field change. Because main reason causing this static magnetic field change is that the magnet for generating main field and pole piece is heated-up by temperature rising of GC coils during the dynamic imaging. To remove this influence, the change of the spatial phase distribution due to static magnetic field change is corrected (in step 321). And temperature change distribution between time t1, ti is calculated (in step 322).

In case static magnetic field is changing with zero dimension, This correction is performed by subtracting the phase change of the reference point, where temperature is not changing on the image, from the whole spatial phase distribution. Because the whole spatial phase distribution is affected uniformly by the change of static magnetic field. For example, if the phase in the selected reference point is φbase, and spatial phase distribution of before and after the correction is φbefore(x,y) and φafter(x,y), equation (3) is expressed as follows.

$$\Phi after(x,y) = \Phi before(x,y) - \Phi base \quad (3)$$

Figure 4:
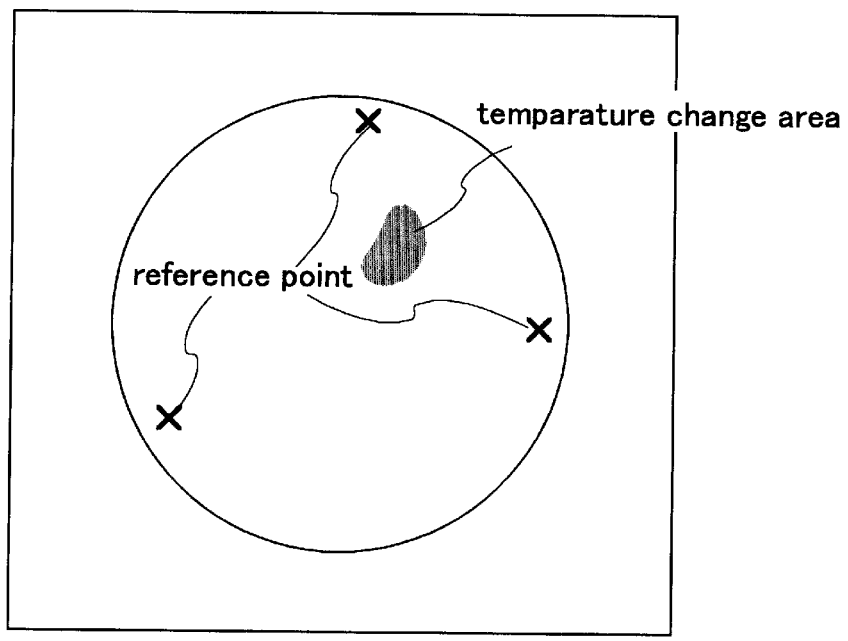
FIG. 4 is a figure showing the first example of display screen of the present invention.

On the other hand, in case static magnetic field is changed linearly, more than three points where temperature is not changing is selected from the image. From the phase changes of those points, change of spatial phase distribution due to static magnetic field change is calculated. Then it is subtracted from the spatial phase distribution. For example, it will be described in the case three points are selected as reference points. And it is restricted to the condition that said three points are not on line as shown in FIG. 4. Because if three points are on line, then coefficient of an equation expressing distribution of spatial phase must be calculated to be infinity. For example, if coordinates of selected reference points are (x1,y1), (x2,y2), (x3,y3), and their phase are $\phi base1$, $\phi base2$, $\phi base3$ respectively, and change of spatial phase distribution is $\phi change(x,y)$, and spatial phase distribution of before and after the correction are respectively $\phi before(x,y)$, $\Phi after(x,y)$, equation (4) is expressed as follows.

$$\Phi after(x,y) = \Phi before(x,y) - \Phi change(x,y)$$

$$\Phi change(x,y) = (-1)*(A*x + B*y + C) \quad (4)$$

In these equations, A, B, C is respectively fixed numbers.

$A = \{(\Phi base1 - \Phi base3)(y1-y2)(\Phi base1 - \Phi base2)(y1-y3)\} / \{((x1-x2)(y1-y3) - (x1-x3)(y1-y2))\}$ $B = \{1/(y2-y1)\} * \{A*(x1-x2) + (\Phi base1 - \Phi base2)\}$ ... in case of y1 y2

$B = \{1/(y3-y1)\} * \{A*(x1-x3) + (\Phi base1 - \Phi base3)\}$ ... in case of y1=y2

$C = (-1) * (A*x1 + B*y1 + \Phi base1)$

Next in case of reference points of n, which is more than three points, will be explained. In this case, it is restricted to the condition that all n points are not on line to prevent that spatial phase distribution is infinity. When coordinates of selected reference points are (xn,yn), and its phase is $\phi base$ n (n is the point number for reference (more than 4 points)), and change of spatial phase distribution is $\phi change(x,y)$, and spatial phase distribution of before and after the correction is respectively $\phi before(x,y)$, $\phi after(x,y)$, equation (4') is expressed as follows. It is difficult to solve strictly in equation (4'), but it is enough to solve approximately the inverse matrix.

$$\Phi after(x,y) = \Phi before(x,y) - \Phi change(x,y)$$

$$\Phi change(x,y) = C - A*x - By \quad (4')$$

In these equations, A, B, C is respectively fixed numbers. They are related as following equations.

$A*x1 + B*y1 + \Phi base1 = C$ $A*x2 + B*y2 + \Phi base2 = C$

.

.

.

$A*xn + B*yn + \Phi basen = C$

Reference points are selected from region where temperature is not changing, but it is preferable to select oil for reference because it has no temperature dependency to the resonance frequency. In this case said oil is placed around the object to be examined. And it is achievable to enclose a sponge including oil in acrylic acid resin and fix it inside receiving coil.

A selection method of the reference points will be explained. For example, arbitrary three points where temperature is not changing in the temperature image are selected as shown in FIG. 4 by click operating them. A serial procedure in this case will be described in FIG. 5. As shown in FIG. 5(a), at first imaging is performed at time t1, ti (in step 500). Complex difference of a spatial phase distribution between time t1 and ti is calculated (in step 501). Temperature change between time t1 and ti is calculated (in step 502). Temperature distribution image between time t1 and ti is displayed (in step 503). Operator selects 3 reference points from region where temperature is not changing, while temperature distribution image is displayed (in step 504). When reference points are selected, the change of spatial phase distribution due to the static magnetic field change from the phase of reference points at time between t1 and tn are calculated (in step 505). Correction is performed by calculating the difference of spatial phase distribution change calculated in step 505 from spatial phase distribution calculated in step 501. And temperature change distribution is recalculated from corrected spatial phase distribution (in step 507). Then corrected image of temperature distribution is displayed (in step 508).

Figure 5B:
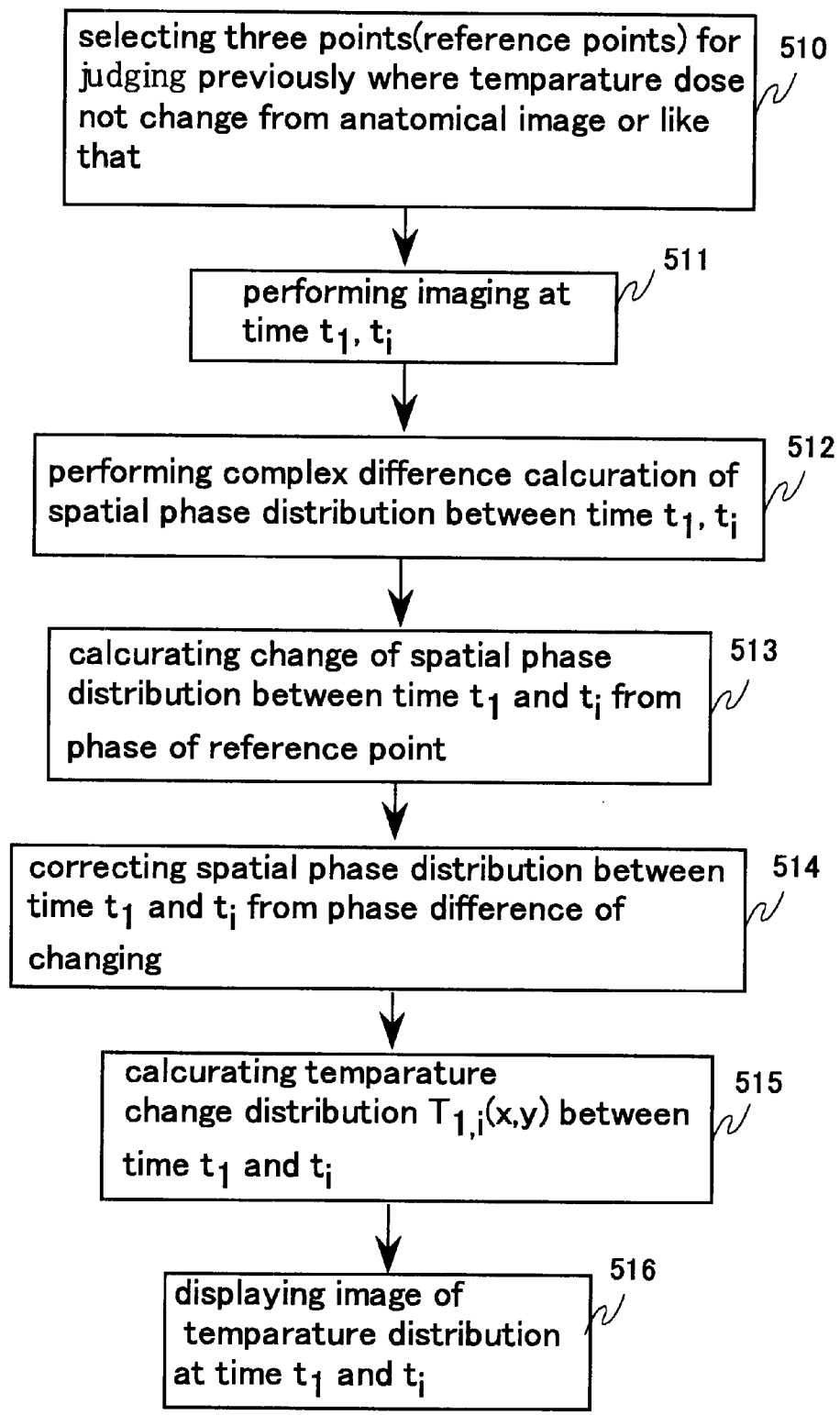

In addition, other procedures will be shown in FIG. 5(b). When region where temperature does not change is known or predicted by comparing temperature distribution image and anatomical image about same part which are displayed in parallel, three points for reference are selected on the anatomical image before imaging (in step 510). If the coordinates of anatomical image and that of temperature distribution image are consistent, then information of reference points is reflected to temperature distribution image even when they are selected on the anatomical image such as in step 510. And imaging at time t1, ti are performed respectively (in step 511), and complex difference of spatial phase distribution between t1 and ti is calculated (in step 512). At this time reference points are already selected, so change of spatial phase distribution due to static magnetic field between time t1 and ti are calculated from the phase of reference points (in step 513). And correction is performed by subtracting change amount of spatial phase distribution calculated in step 513 from spatial phase distribution calculated in step 512 (in step 514). And temperature change distribution is calculated from corrected spatial phase distribution (in step 515), and image of corrected temperature distribution is displayed (in step 516).

Figure 6:
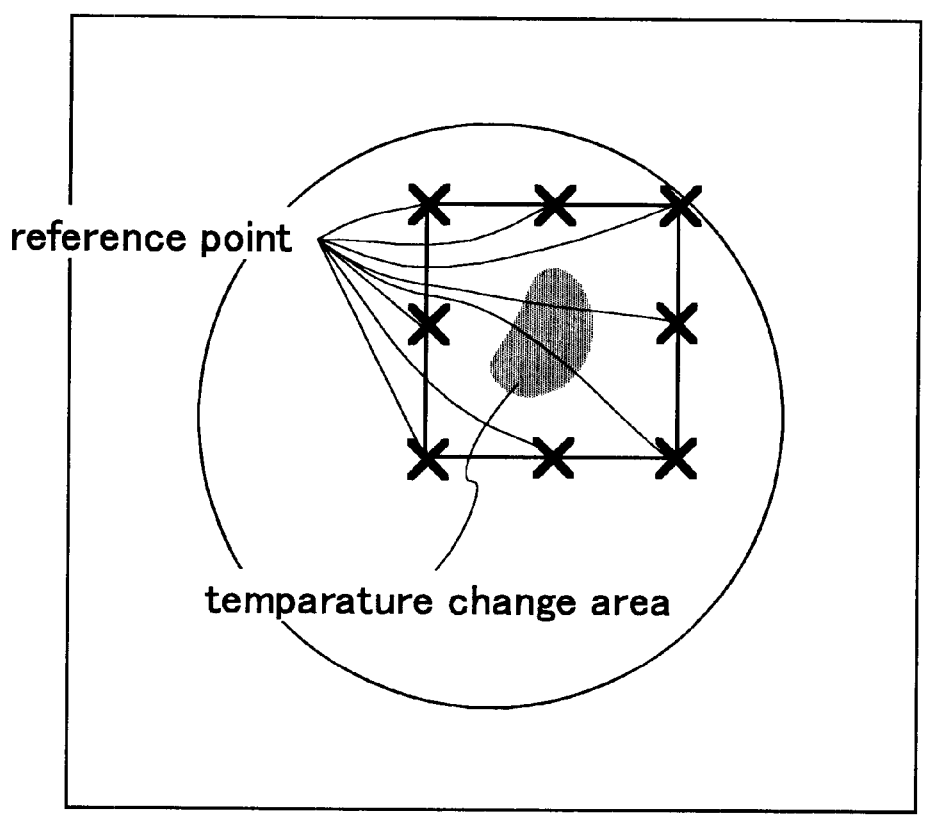
FIG. 6 is a figure showing the second example of screen of the present invention.
Figure 7A:
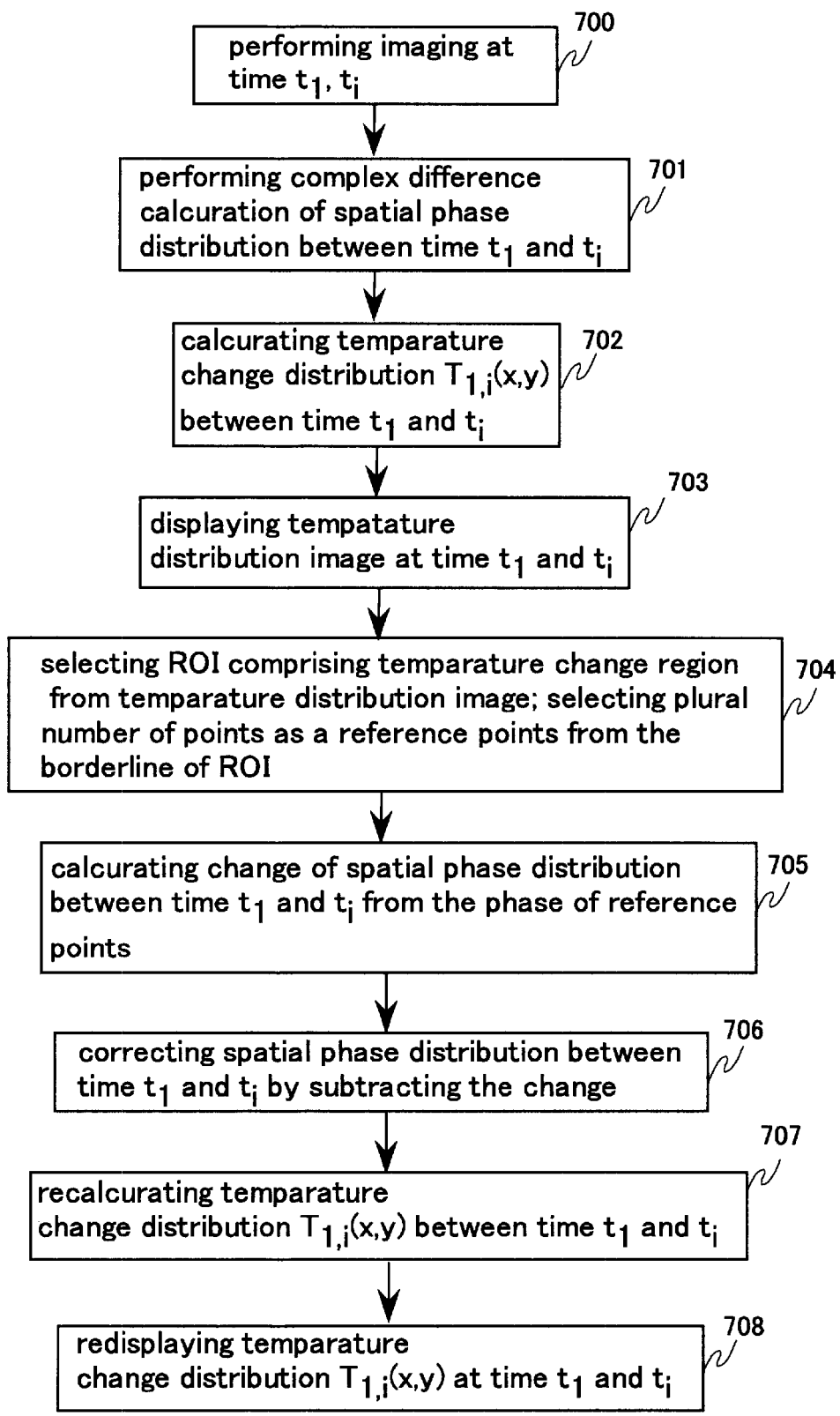
FIGS. 7(a)–(b) is a flow chart showing one example of selection of another reference point in the embodiment of the present invention.

Next, a method for selecting reference points by specifying ROI will be described. For example, ROI is specified by operation to surround temperature change region on a temperature distribution screen by operator as shown in FIG. 6. Being specified ROI, plural number of reference points on the borderline of ROI are automatically selected. In the case of example shown in FIG. 6, reference points of 8 are selected on borderline of ROI. A serial procedure in this case will be described in FIG. 7. At first as shown in FIG. 7(a), imaging at time t1 and ti are respectively performed (in step 700). Complex subtraction of spatial phase distribution between time t1 and ti is calculated (in step 701). Temperature change between time t1 and ti is calculated (in step 702). And temperature distribution image between time t1 and ti is displayed (in step 703). During temperature distribution image is displayed, operator specifies ROI, such that the line of ROI is not covered with temperature change region. At the same time ROI is specified, reference points of a plural number (eight points) are selected on the borderline of ROI (in step 704). When reference points are selected, change of spatial phase distribution due to static magnetic field between time t1 and ti is calculated from the phase of reference points (in step 705). And correction is performed by subtracting the change of spatial phase distribution calculated in step 705 from spatial phase distribution calculated in step 701 (in step 706). And temperature change distribution is recalculated from corrected spatial phase distribution (in step 707). Corrected temperature distribution image is displayed (in step 708). Thus, selecting reference points with the selection of ROI, operator needs only to specify ROI, and therefore his time for inputting reference points is saved. So operation for performing temperature correction is easy.

Figure 7:
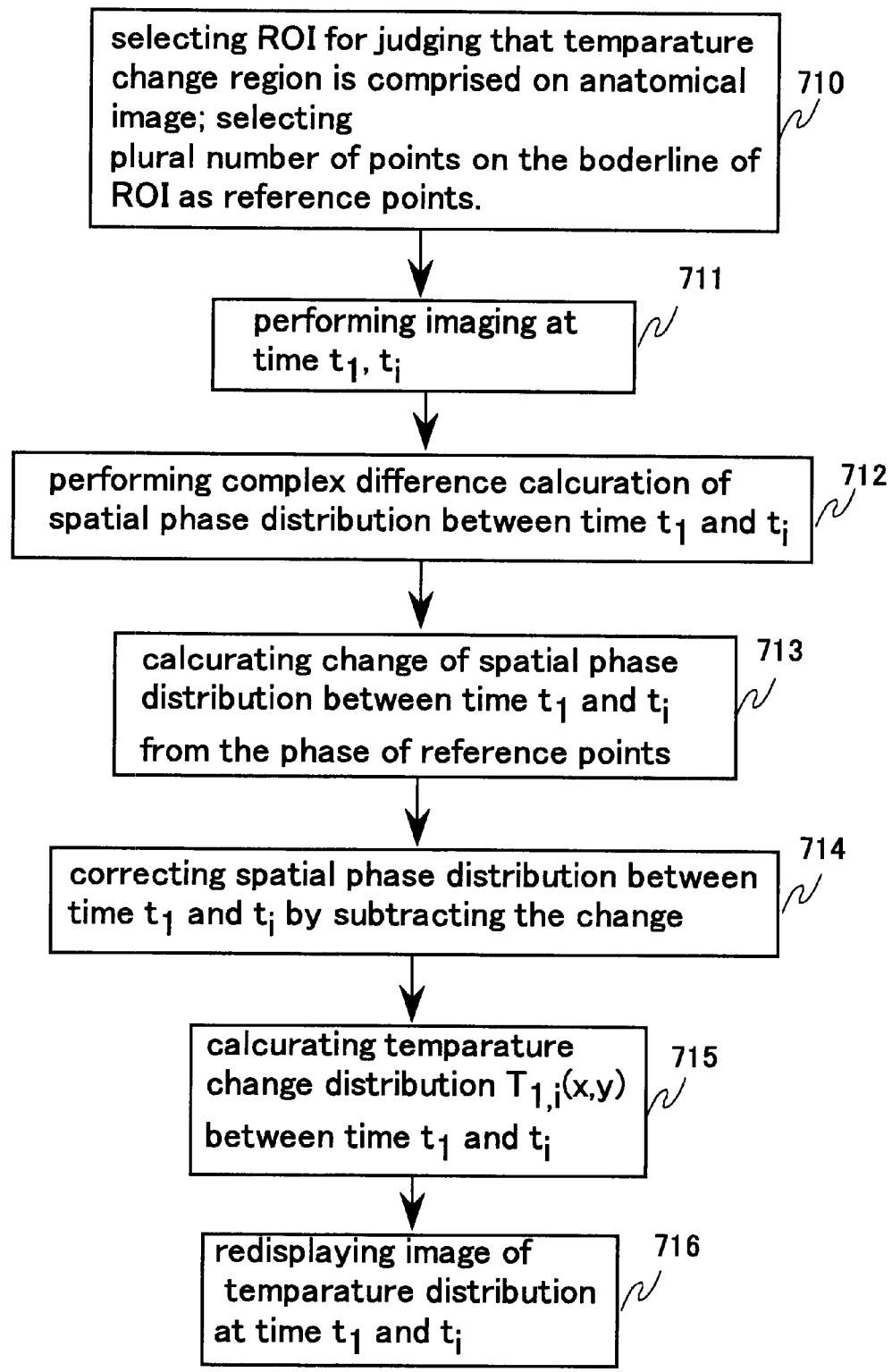
Figure 8:
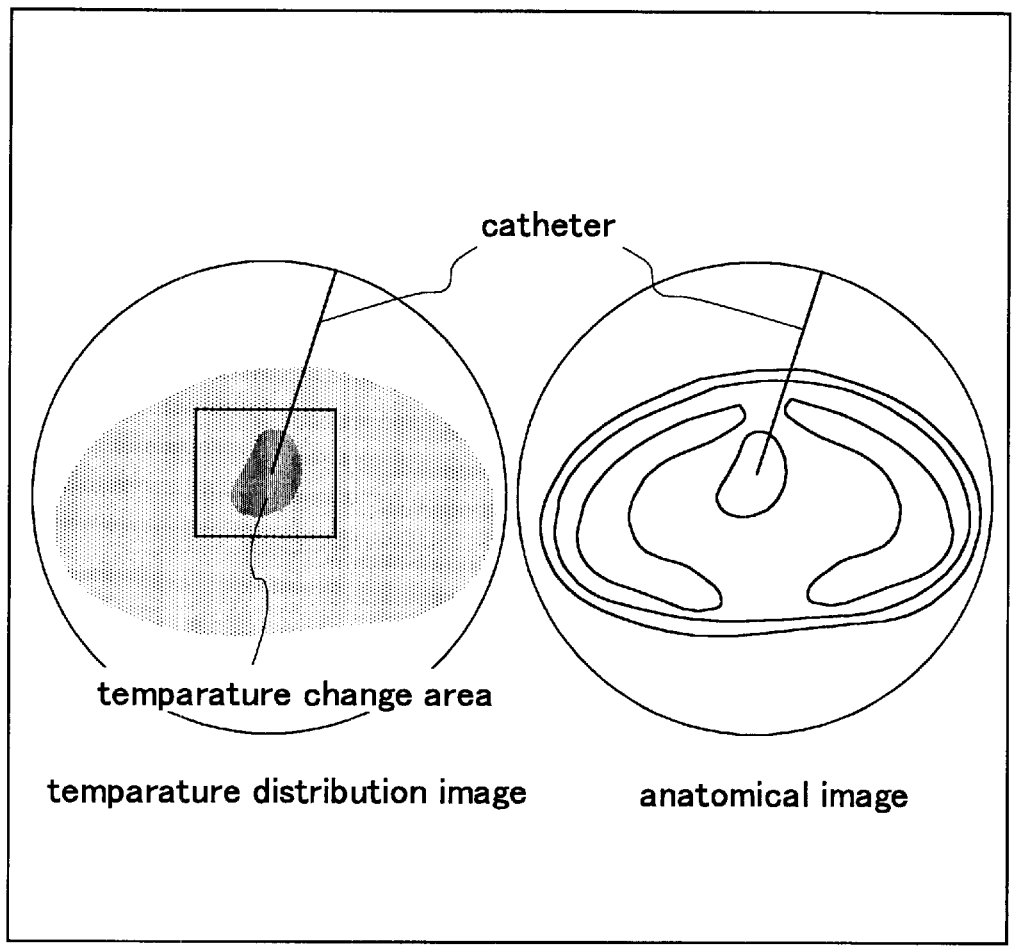
FIG. 8 is a figure showing the third example of screen of the present invention.

In addition, other procedures are shown in FIG. 7(*b*). In case a position and size of a temperature change region are known beforehand (or predicted), ROI is specified from the anatomical image before imaging. A reference point of a plural number point (eight points) is selected by specifying this ROI (in step 710). If a coordinate of anatomical image is made to be consistent with that of temperature distribution image as same as the case of selecting 3 points previously described, and even reference points are selected in the anatomical image as shown in step 710, then information of their reference points to temperature distribution image can be reflected. And imaging is respectively performed at time t1 and ti (in step 711), complex difference of spatial phase distribution between time t1, ti is calculated (in step 712). Reference points are already selected, so the change of spatial phase distribution due to static magnetic field between time t1 and ti is calculated from the phase of reference points (in step 713). Correction is performed by subtracting spatial phase distribution change calculated in step 713 from spatial phase distribution calculated in step 712 (in step 714). And temperature change distribution is calculated from corrected spatial phase distribution (in step 715). And corrected temperature distribution image is displayed (in step 716).

In this embodiment, number of reference points selected on the borderline of ROI was 8, but it is not restricted to 8. It can be selected the number more than 8. For example, if 25 points are selected on one side of ROI, then 25×4=100 points are selected for reference points. In accordance with increasing number of reference points, the change amount is more precisely acquired, and the stabilization of correction is increased. In addition, the form of ROI is not restricted to a square. A circle or arbitrary shape is also able to apply for it.

In case of specifying ROI, it is preferable to specify so as to surround the temperature change region. This reason is for selecting reference points on the borderline of ROI. And this is the reason there is a possibility to specify reference points in temperature change region, if temperature change region is overlapped on the line of ROI. In addition, in case line of ROI is in outside of the object to be examined, there is a possibility to specify reference points in outside of the object. Thus if reference points are specified in the temperature change region or outside of the object, then there is a possibility that accurate correction is not performed. Then, hereinafter selecting method of reference points, in case temperature change region is on the borderline of ROI or in outside of the object, will be explained.

For example, when the borderline of ROI is overlapped with the temperature change region or outside of the object, the temperature change region and outside part of the object are not used as reference points. Thus, only the points not changing temperature are selected as reference points. Judgment whether the temperature change or the outside region of the object the line region on the line of ROI is overlapped or not is performed by the operator under observation image. Then reference points in the temperature change region or outside region of the object are excluded by the operator's selection. Although the operator himself can set the ROI again, but in case he has to select ROI repeatedly or it is troublesome for him to select because there are many reference points for selecting, it is possible to select automatically the reference points from the data investigated on the borderline of ROI. The judgment whether temperature change region is overlapped on the borderline of ROI or not is performed by investigating temporal temperature change at those reference points, when temperature at each reference points changes more than predetermined threshold value, the judgment is made that reference point is overlapped on the temperature change region. And whether the reference point is the outside region of the object or not is judged with signal intensity of an absolute value image. And if its value is low, then the judgment is made that it is outside of the object to be examined.

In the above-mentioned embodiment, it is explained about the case that corrected temperature distribution image is displayed. The temperature distribution image involves only temperature change, but anatomical change is not considered. So displaying temperature distribution image and anatomical image in parallel, both changes are able to observe at the same time.

In addition, for the temperature change region, an object of the correction can be restricted inside ROI. Corrected temperature distribution image inside ROI can be displayed to superimpose upon anatomical image as shown in FIG. 9(*a*). In addition, as shown in FIG. 9(*b*), on the basis of observation temporal temperature change inside ROI, only the part changing more than predetermined value is judged the temperature change region, and only this region can be superimposed upon the anatomical image for display. Thus, confirmation is easily to find the place where the temperature is changing in anatomical image.

Figure 10:
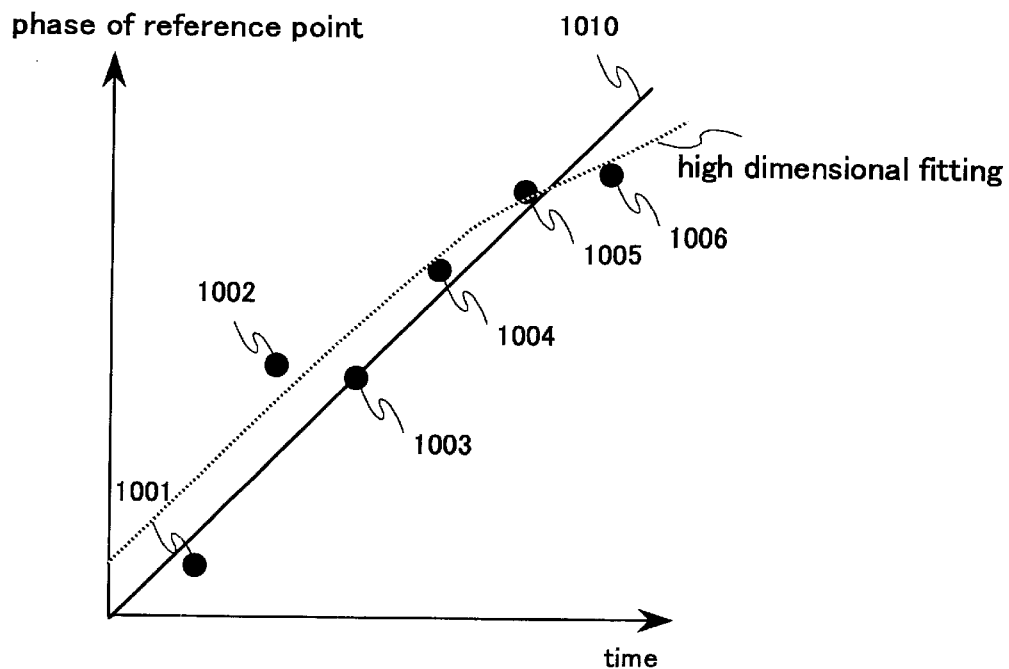
FIG. 10 is a figure showing another embodiment of the present invention.
Figure 11:
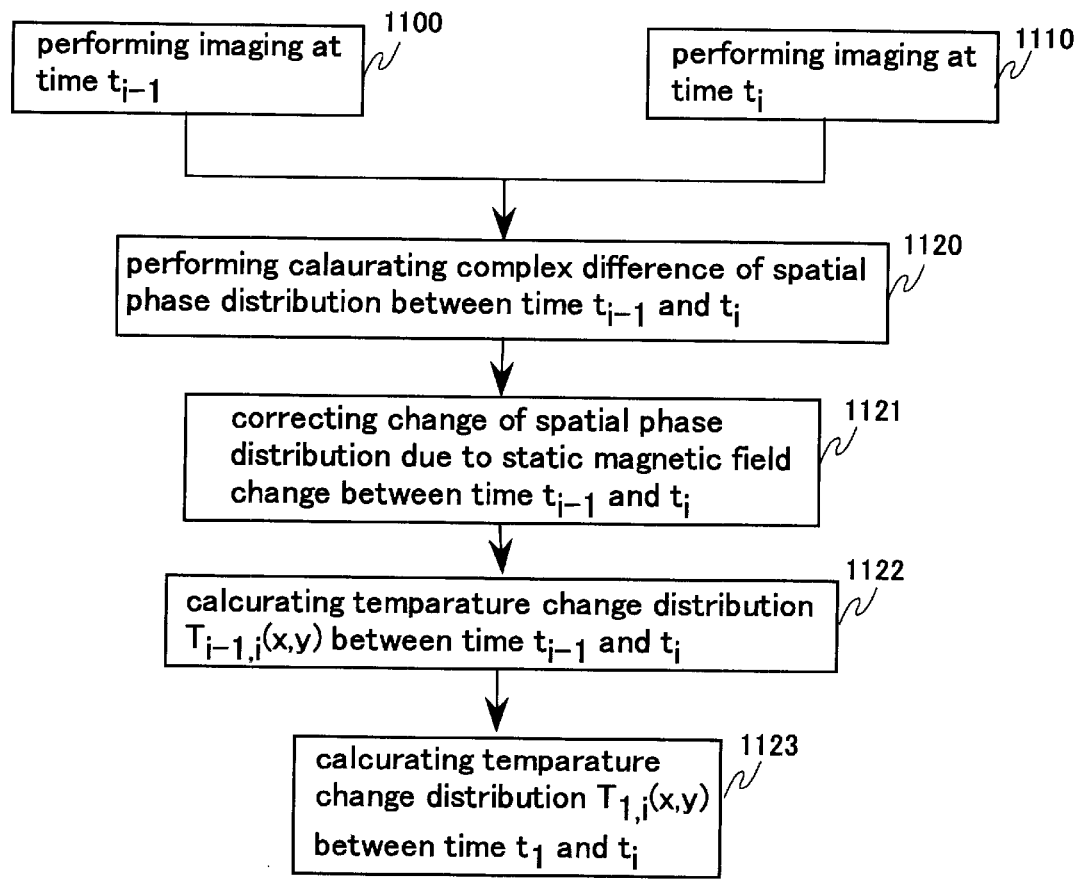
FIG. 11 is a figure showing a flow chart in another embodiment of the present invention.

In addition, as a data for reference phase, the phase about only one pixel can be used, and average value about several pixels can also be used. Furthermore, static magnetic field changes continually, so it is preferable to perform fitting temporally it so as not to be influenced by noise or the like, as shown in FIG. 10 (1001~1007 are the practical phase of reference points. And 1010 is the line by fitting in one dimensional.). It is preferable to perform high dimensional fitting, for example two dimension. In this case, it is more precise to express the temporal change of magnetic field in comparison with the case of one dimension.

After the above-mentioned correction, temperature change between time t1 and ti is calculated in equation (2). In this result, temperature change is precisely measured.

In addition, in case static magnetic field change is large in a short time, or measuring time is long, or TE is short, phase of nuclear spin between time t1 and ti can be turned more than $\pi$ radian. To avoid this influence, it is need to perform imaging in a period shorter than time interval t1 and ti (between ti-1 and ti) (in step 1100, 1110). And it is preferable to calculate temperature change T1,i between time t1, ti, after calculating complex difference of spatial phase distribution between time ti-1 and ti (in step 1120), and correction of spatial phase distribution (in step 1121), and calculation of temperature distribution image between time ti-1 and ti. Temperature change T1,i in this case is expressed, for example, with equation (5).

$$T_{1,i} = \sum_{n=0}^{i} T_{i-1,i} \qquad (5)$$

As mentioned above, accurate temperature change distribution can be obtained by performing complex difference calculation of spatial phase distribution at different time, and correction of the spatial phase distribution due to static magnetic field with subtracting reference phase from calculated spatial phase distribution difference. In addition, correspondence to high dimensional static magnetic field change is possible to apply plural number of points for reference phase.

According to the present invention, there is no need to set resonance frequency at each imaging, because complex difference calculation of spatial phase distribution is performed, and correction of static magnetic field change is performed to the subtracted spatial phase distribution. Thus accurate image of temperature change distribution can be measured without time expansion.

The preferred embodiment of the present invention is explained with referring to figures. However, the present invention can be varied within the scope not exceeding the points of the present invention.

What is claimed is:

1. A magnetic resonance imaging apparatus comprising:
    static magnetic field generation means for applying a static magnetic field to an object to be examined,
    gradient magnetic field generation means for applying a slice direction gradient magnetic field, a frequency encode gradient magnetic field and a phase encode gradient magnetic field to said object to be examined,
    high frequency pulse generation means for generating a high frequency pulse to cause a magnetic resonance phenomenon to a nucleus composing said object,
    detecting means for detecting a nuclear magnetic resonance signal emitted from said object,
    image reconstruction means for image-reconstructing said nuclear magnetic resonance signal,
    display means for displaying said reconstructed image, and
    control means for performing controlling said static magnetic field generation means, said gradient magnetic field generation means, said high frequency pulse generation means, said detecting means, said image reconstruction means, and said display means,
    wherein said control means measures a spatial phase distribution including temperature information at different measuring times, and calculates a complex difference of spatial phase distribution between said different measuring times, and searches a reference phase in said spatial phase distribution, and calculates a difference between said reference phase and said spatial phase distribution applied to said difference calculation, and searches a temperature change distribution from said spatial phase distribution applied to said phase difference calculation.

2. A magnetic resonance imaging apparatus according to claim 1, further comprising selection means for selecting an arbitrary position in the image displayed on said display means, and said control means searches said reference phase from the position selected by said selecting means.

3. A magnetic resonance imaging apparatus according to claim 1, in which said control means obtains the reference phase from at least one point where temperature is not changing.

4. A magnetic resonance imaging apparatus according to claim 1, in which said control means obtains the reference phase from a region where temperature is not changing and a plural number of points which is not located on a straight line.

5. A magnetic resonance imaging apparatus according to claim 1, in which said display means displays a temperature image including the temperature information and a reconstructed anatomical image in parallel.

6. A magnetic resonance imaging apparatus according to claim 1, in which said display means displays a temperature change region in a temperature image including the temperature information superimposed upon a reconstructed anatomical image.

7. A magnetic resonance imaging apparatus according to claim 2, in which said selection means specifies the arbitrary region in the image displayed on said display means and selects a plural number of points for calculating said reference phase on a line in the arbitrary region.

8. A magnetic resonance imaging apparatus according to claim 7, in which said selection means specifies the arbitrary region including a temperature change region.

9. A magnetic resonance imaging apparatus according to claim 1, in which said control means performs a fitting process taking into consideration a temporal change of said reference phase.

10. A magnetic resonance imaging apparatus comprising:
    static magnetic field generation means for applying a static magnetic field to an object to be examined,
    gradient magnetic field generation means for applying a slice direction gradient magnetic field, a frequency encode gradient magnetic field and a phase encode gradient magnetic field to said object to be examined,
    high frequency pulse generation means for generating a high frequency pulse to cause a magnetic resonance phenomenon to a nucleus composing said object,
    detecting means for detecting a nuclear magnetic resonance signal emitted from said object,
    image reconstruction means for image-reconstructing said nuclear magnetic resonance signal,
    display means for displaying said reconstructed image, and
    control means for performing controlling said static magnetic field generation means, said gradient magnetic field generation means, said high frequency pulse generation means, said detecting means, said image reconstruction means, and said display means,
    in which said control means measures a phase at different measuring times at a specified region including temperature information, and searches a reference phase from said specified region, and calculates a difference between said reference phase and said measured phase, and outputs said difference in phase to said display means as corrected temperature information.

11. A magnetic resonance imaging apparatus comprising:
    static magnetic field generation means for applying a static magnetic field to an object to be examined,
    gradient magnetic field generation means for applying a slice direction gradient magnetic field, a frequency encode gradient magnetic field and a phase encode gradient magnetic field to said object to be examined,
    high frequency pulse generation means for generating a high frequency pulse to cause a magnetic resonance phenomenon to a nucleus composing said object,
    detecting means for detecting a nuclear magnetic resonance signal emitted from said object, image reconstruction means for image-reconstructing said nuclear magnetic resonance signal, display means for displaying said reconstructed image, and control means for performing controlling said static magnetic field generation means, said gradient magnetic field generation means, said high frequency pulse generation means, said detecting means, said image reconstruction means, and said display means, in which said control means measures a spatial phase distribution at different measuring times including temperature information, and searches a reference phase in said spatial phase distribution, and calculates a difference between said reference phase and said spatial phase distribution, and searches a distribution of temperature change from said spatial phase distribution applied to said difference calculation.

12. A magnetic resonance imaging method comprising the steps of:

applying a static magnetic field to an object to be examined, applying a gradient magnetic field to said object in three direction, transmitting a high frequency pulse for causing a magnetic resonance phenomenon to an atomic nucleus composing said object, detecting a nuclear magnetic resonance signal emitted from said object, reconstructing an image from said nuclear magnetic resonance signal, and displaying said reconstructed image, further including:

a step for measuring a spatial phase distribution including temperature information from said nuclear magnetic resonance signal in a first time, a step for measuring the spatial phase distribution including temperature information from said nuclear magnetic resonance signal in a second time, a step for correcting a change of spatial phase distribution due to a static magnetic field change between said first time and said second time, and a step for calculating a temperature change distribution from said corrected spatial phase distribution.

13. A magnetic resonance imaging method according to claim 12, in which said correcting step of said change of spatial phase distribution includes:

a step for calculating a reference phase in said spatial phase distribution, and a step for calculating a difference between said reference phase and said spatial phase distribution.

14. A magnetic resonance imaging method according to claim 12, further including a step for displaying simultaneously an image of said temperature change distribution and said reconstructed image.

15. A magnetic resonance imaging method according to claim 12, further including a step for superimposing said temperature change distribution image upon' said reconstructed image.

16. A magnetic resonance imaging method comprising the steps of:

applying a static magnetic field to an object to be examined, applying a gradient magnetic field to said object in three direction, transmitting a high frequency pulse for causing a magnetic resonance phenomenon to an atomic nucleus composing said object, detecting a nuclear magnetic resonance signal emitted from said object, reconstructing an image from said nuclear magnetic resonance signal, and displaying said reconstructed image, further including:

a step for measuring a spatial phase distribution including temperature information from said nuclear magnetic resonance signal at two different times t1 and t2 in a measurement region, a step for calculating a temperature change distribution at the different times t1 and t2 from said spatial phase distribution, a step for displaying an image corresponding to said temperature change distribution, a step for selecting at least 3 points from said image corresponding to said temperature change distribution, a step for calculating a change of spatial phase distribution at at least said 3 points between the different times t1 and t2, a step for subtracting a change amount of said spatial phase distribution from spatial phase distribution measured in said measurement region, a step for recalculating a temperature change distribution from said subtracted spatial phase distribution, and a step for displaying as image corresponding to the recalculated temperature change distribution.

17. A magnetic resonance imaging method according to claim 16, in which said step for selecting at least 3 points includes a step for selecting at least 3 points where temperature is not changing.

18. A magnetic resonance imaging method according to claim 16, in which step for selecting at least said 3 points further includes a step for selecting a plural number of points on a region of interest by setting the region of interest so as to surround a temperature change region, and selecting a plural number of points on said region of interest where temperature is not changing.

* * * * *